United States Patent
Hürner et al.

(10) Patent No.: US 10,141,456 B2
(45) Date of Patent: Nov. 27, 2018

(54) SCHOTTKY DIODE AND METHOD FOR ITS MANUFACTURING

(71) Applicant: Fraunhofer Gesellschaft Zur Förderung Der Angew. Forschung E.V., Munich (DE)

(72) Inventors: Andreas Hürner, Nürnberg (DE); Tobias Erlbacher, Poxdorf (DE)

(73) Assignee: Fraunhofer Gesellschaft Zur Forderung Der Angew. Forschung E.V., Munich (DE)

(*) Notice: Subject to any disclaimer, the term of this patent is extended or adjusted under 35 U.S.C. 154(b) by 65 days.

(21) Appl. No.: 15/295,146

(22) Filed: Oct. 17, 2016

(65) Prior Publication Data

US 2018/0108788 A1   Apr. 19, 2018

(51) Int. Cl.
*H01L 29/872* (2006.01)
*H01L 23/552* (2006.01)
(Continued)

(52) U.S. Cl.
CPC ........ *H01L 29/872* (2013.01); *H01L 21/0262* (2013.01); *H01L 21/02376* (2013.01); *H01L 21/02527* (2013.01); *H01L 21/02634* (2013.01); *H01L 23/552* (2013.01); *H01L 27/0248* (2013.01); *H01L 29/0619* (2013.01);
(Continued)

(58) Field of Classification Search
CPC ............. H01L 21/0435; H01L 21/0495; H01L 21/28537; H01L 21/21581; H01L 29/0891; H01L 29/66848–29/66886; H01L 29/7839; H01L 29/806; H01L 29/812–29/8128; H01L 31/1121–31/1123; H01L 33/0033; H01L 29/47–27/475; H01L 29/66174
See application file for complete search history.

(56) References Cited

U.S. PATENT DOCUMENTS 6,582,513 B1   6/2003   Linares et al.
8,158,455 B2   4/2012   Linares
(Continued)

OTHER PUBLICATIONS

Hiraiwa, Atsushi et al., "Figure of merit of diamond power devices based on accurately estimated impact ionization processes," Journal of Applied Physics 114, 034506 (2013).
Kone, S. et al., "High performances CVD diamond Schottky barrier diode—Simulation and carrying out," Institute of Electrical and Electronics Engineers, 13th European Conference on Power Electronics and Applications (2009).
(Continued)

*Primary Examiner* — Julio J Maldonado
*Assistant Examiner* — Stanetta Isaac
(74) *Attorney, Agent, or Firm* — Alix, Yale & Ristas, LLP

(57) ABSTRACT

The invention disclosure describes a manufacturing method for realizing so-called JBS areas for a unipolar power diode on the basis of diamond. In this special method, an n-doped layer is applied to the typically p-doped drift region, e.g. by means of epitaxial layer growth. The applied n-doped layer is then removed again in defined areas. A photolithographic mask may be applied and the n-doped layer is removed by dry or wet chemical etching. Having structured the JBS areas, the Schottky metal is applied to the entire surface. The resulting JBS structure shields an electric field generated by an applied reverse voltage from the Schottky transition. The reverse voltage from which the Schottky transition is fully shielded can be adjusted by altering the distance between the JBS areas.

21 Claims, 2 Drawing Sheets

(51) Int. Cl.
    *H01L 27/02*     (2006.01)
    *H01L 29/66*     (2006.01)
    *H01L 29/16*     (2006.01)
    *H01L 21/02*     (2006.01)
    *H01L 29/06*     (2006.01)

(52) U.S. Cl.
    CPC ...... *H01L 29/1602* (2013.01); *H01L 29/6603* (2013.01); *H01L 21/02576* (2013.01)

(56) References Cited

U.S. PATENT DOCUMENTS

2013/0140584 A1* 6/2013 Kameshiro ........... H01L 29/861 257/77
2015/0263180 A1* 9/2015 Hirakata ............... H01L 29/872 257/77

OTHER PUBLICATIONS

Marechal, A. et al., "Diamond bipolar device simulation," Institute of Electrical and Electronics Engineers, Workshop on Wide Bandgap Power Devices and Applications (WiPDA), 2013.

Teraji, Tokuyuki et al., "Schottky barrier height and thermal stability of p-diamond (100) Schottky interfaces," This Solid Films, vol. 557, pp. 241-248 (Apr. 2014).

Traore, A. et al., "Zr/oxidized diamond interface for high power Schottky diodes," Applied Physics Letters 104, 052105 (2013).

Umezawa, Hitoshi et al., "Leakage current analysis of diamond Schottky barrier diodes operated at high temperature," Japanese Journal of Applied Physics 53, 04EP04 (2014).

Wort, Chris J. H. et al., "Diamond as an electronic material," Materials Today, vol. 11, No. 1-2 (2008).

* cited by examiner

SCHOTTKY DIODE AND METHOD FOR ITS MANUFACTURING

BACKGROUND

The disclosure relates to diamond Schottky diodes and methods of manufacturing diamond Schottky diodes.

Modern semiconductors are typically based on silicon, with various elements doped to change their electrical properties. For example, doping silicon with phosphorous creates a surplus of electrons resulting in n-type semiconductor material due to the fifth valence electron not present in silicon, which has only four valence electrons. Similarly, doping silicon with boron creates p-type silicon having a surplus of "holes", or an absence of electrons, because boron has only three valence electrons which is one fewer than silicon. Silicon can be doped by diffusion or ion implantation, as is known in the art. When n-type and p-type silicon are in contact with one another, electricity flows in one direction across the junction more easily than in the other direction. More complex configurations of n-type and p-type material can be assembled to form various types of transistors, integrated circuits, and other such devices.

The Schottky potential barrier at a metal/semiconductor contact is ideal for fast switching, and low voltage drop in the forward conduction mode reduces the power dissipation of the device. Therefore, the Schottky diode is a preferred over the PN junction diodes in many power applications. When high voltage and high current are applied to a Schottky diode, the energy dissipated in the device leads to an increase in temperature. At room temperature, the reverse current is decided by the field emission mechanism in which the current tunnels through the Schottky barrier. At high temperatures, the thermal field emission mode becomes dominant and not only the tunneling current, but also carriers having heat energy pass over the Schottky barrier as a reverse leakage current. It is therefore necessary to control the accumulation of heat in Schottky diodes employed in high power applications. The effectiveness of cooling systems is limited by the thermal conductivity of the materials from which the diode is constructed.

Silicon (Si) has a thermal conductivity of 1.5 W/cmK and Silicon Carbide (SiC) has a thermal conductivity of 4.9 W/cmK. Diamond has a thermal conductivity of 22.0 W/cmK, which is the highest value among all materials, making diamond very attractive as a material for power handling semiconductor components.

In addition to high thermal conductivity, diamond is a semiconductor with electrical properties suitable for manufacture of devices such as Schottky diodes, and superior to Silicon or Silicon Carbide. For example, diamond has a band gap of about 5.47 eV, compared to 1.1 eV for Si and 3.2 eV for (4H) SiC. On account of this band gap and the associated high critical field strength of about 10 $MVcm^{-1}$ and low intrinsic charge carrier concentration which, even at temperatures above 300° C., is still markedly below typically used doping concentrations, unipolar power components having reverse strengths of markedly above 100 kV and simultaneously low static and dynamic losses can be produced on the basis of diamond. Due to this, it would be possible to replace the series-connected bipolar power rectifiers on the basis of silicon, which are used in this voltage range, e.g. in the transmission of high voltage direct current, with unipolar power rectifiers on the basis of diamond. This would considerably reduce the costs which are required to cool the bipolar power rectifiers on the basis of silicon and the weight and the volume for the power-electronic components, e.g. in the transmission of high voltage direct current. Another advantage which results from the low intrinsic charge carrier concentration of diamond is the fundamental applicability at temperatures of markedly above 500° C.

To create a functional diamond-based unipolar power diode, it is necessary to limit the electric field at the boundary between the diamond substrate and the Schottky metal. Without such a limitation, the effective Schottky barrier would be markedly reduced when a reverse voltage is applied and the reverse current would increase significantly. Ultimately, this would heat the power diode, and cause the thermal destruction of the diode in extreme cases. Such a limitation is absolutely necessary for an actual use of unipolar power diodes on the basis of diamond due to the critical field strength which is high compared to silicon and silicon carbide. The challenge is now to realize an appropriate component structure in order to limit the electric field.

The current state of manufacturing technology has limited the production of diamond-based power components. Specifically, it has only recently become possible to manufacture diamond substrates with low defect density and dimensions needed for component manufacture.

Nevertheless, the fundamental functional principle of unipolar power diodes on the basis of diamond has already been shown by way of experiment. The diamond based semiconductor devices typically have a first p-doped diamond region, a p-doped drift region having a thickness of about 10 μm and a boron doping of about $1 \times 10^{16}$ $cm^{-3}$ as well as an Au/Mo and/or Au/Ru coating. The Au/Mo and/or Au/Ru coatings here form a potential barrier with respect to the p-doped drift region, which results in a threshold voltage of about 1.2 V. With an operating temperature of 250° C. it is possible to achieve forward voltages within the range of about 2.5 V with the present structure for a diamond Schottky diode when the forward current density is 100 $Acm^{-2}$. Considering the nominal reverse voltage of about 2 kV, which results from the thickness and doping of the drift region, the shown forward voltage highlights the fundamental advantages which diamond has over comparable semiconductor materials.

Experimental results for the electric characterization of the barrier properties show a marked increase in the reverse current when reverse voltages are already markedly below the maximum reverse voltage of 2 kV. This increase in the reverse current which, with a reverse voltage of only 300 V, already leads to a loss of the barrier capacity of the unipolar power diode on the basis of diamond, can be ascribed, on the one hand, to defects in the crystal layer and, on the other hand, to the need to limit the electric field at the boundary between the diamond substrate and the Schottky metal. The described problem has not yet been specified with unipolar power diodes on the basis of diamond.

As to unipolar power diodes on the basis of silicon or silicon carbide, the described problem is typically solved by introducing so-called JBS areas. N-doped regions which are introduced into a p-doped drift region by means of a method for selective doping (diffusion, ion implantation). When a negative reverse voltage is applied to the cathode, the space-charge region (SCR) spreads between the p-doped JBS strip into the n-doped drift region and narrows the transitional region between the JBS strip. Due to this narrowing, the Schottky metal is shielded from the electric field, and the resulting reduction in the effective Schottky barrier is markedly reduced. However, it is not easy to apply the described method to unipolar power diodes on the basis of diamond. This is substantially due to the limited doping capacity of diamond. In contrast to Silicon or Silicon carbide, selective doping methods, such as diffusion and implantation, cannot be used in the diamond technology and the diamond can only be doped during the crystal growth. Therefore, the realization of a unipolar power diode on the basis of diamond calls for a novel concept in order to realize the JBS areas.

There is a need in the art for methods of manufacturing JBS areas on diamond semiconductor material.

SUMMARY

The invention disclosure describes a manufacturing method for realizing so-called JBS areas for a unipolar power diode on the basis of diamond. In this special method, an n-doped layer is applied to the typically p-doped drift region, e.g. by means of epitaxial layer growth. The applied n-doped layer is then removed again in defined areas. A photolithographic mask may be applied and the n-doped layer is removed by dry or wet chemical etching. Having structured the JBS areas, the Schottky metal is applied to the entire surface. The resulting JBS structure shields an electric field generated by an applied reverse voltage from the Schottky transition. The reverse voltage from which the Schottky transition is fully shielded can be adjusted by altering the distance between the JBS areas.

DETAILED DESCRIPTION

In the following detailed description of representative embodiments of the invention, reference is made to the accompanying drawings which form a part of the description, and in which is shown by way of illustration specific sample embodiments in which the invention may be practiced. These embodiments are described in sufficient detail to enable those skilled in the art to practice the invention, and it is to be understood that other embodiments may be utilized and that logical, mechanical, electrical, and other changes may be made without departing from the substance or scope of the present invention. The following detailed description is, therefore, not to be taken in a limiting sense, and the scope of the invention is defined only by the appended claims.

Figure 1:
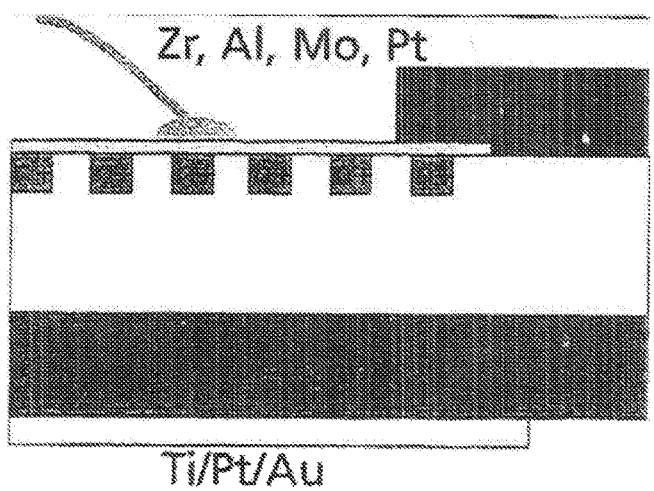
FIG. 1 illustrates a theoretical embodiment of a diamond Schottky diode constructed by doping a diamond substrate.

FIG. 1 illustrates a theoretical embodiment of a diamond Schottky diode, where doped areas are created in a diamond substrate. In theory, if the doping concentration can be high enough, the operation of such a diamond Schottky diode would be comparable to the operation of a silicon or silicon carbide Schottky diode of the prior art. However, such an embodiment is only possible in theory, since techniques for doping a diamond substrate to create the illustrated structure have not yet been developed.

Figure 2:
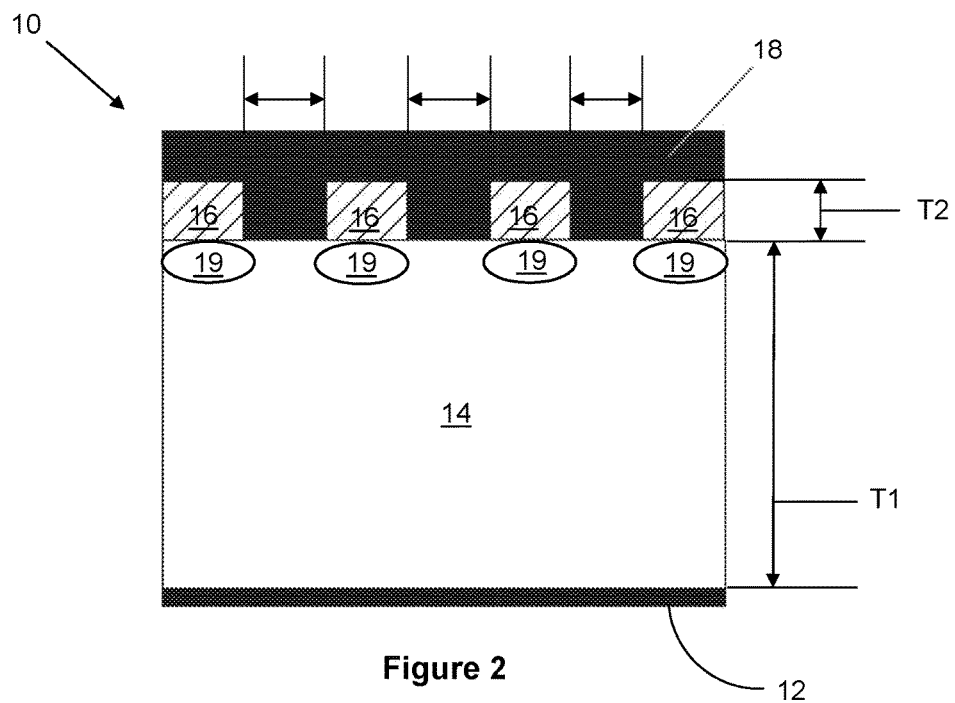
FIG. 2 illustrates a diamond Schottky diode constructed according to the disclosure.

With reference to FIG. 2, a diamond Schottky diode according to aspects of the disclosure is designated by the number 10. An Ohmic contact anode 12 is applied to one side of a doped diamond drift region 14 having a first conductivity type. The anode 12 may be constructed of Ti, Pt, Au or alloys thereof. JBS regions 16 of doped diamond having a second conductivity type, opposite the conductivity type of the drift region 14 are constructed on a side of the drift region 14 opposite the anode 12. A Schottky metal 18 is applied over the JBS regions 16, filling the areas between the JBS regions 16 and contacting the sides of the JBS regions as well as the surface of the drift layer 14 between the JBS regions.

Figure 3:
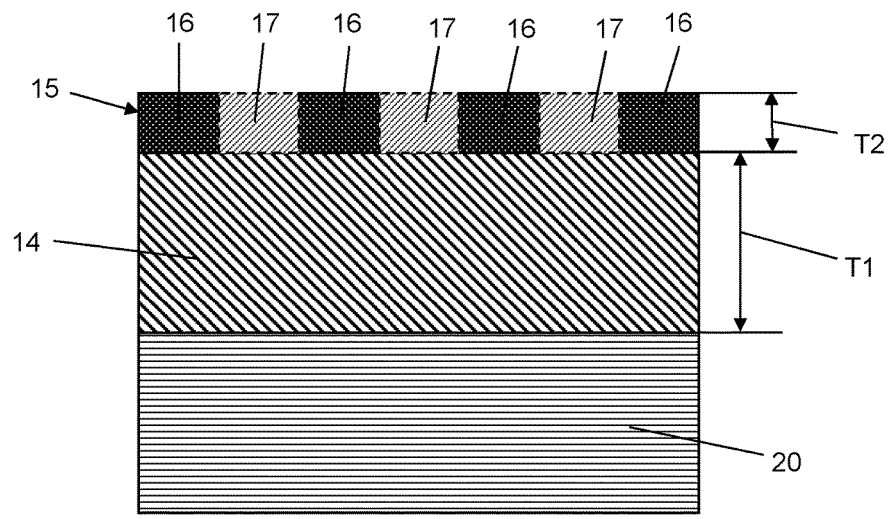
FIG. 3 is a sectional view through an embodiment of a diamond Schottky diode according to aspects of the disclosure, before removal of a substrate 20 and configuring of the JBS areas 16.

In one disclosed embodiment, the doped diamond drift region 14 is a diamond crystal formed from the gas phase by a chemical vapor deposition (CVD) process from a gas mixture of at least hydrogen and at least one hydrocarbon such as methane (CH4). With reference to FIG. 3, according to aspects of the disclosure, the drift region 14 is formed by CVD onto a diamond substrate 20, or "seed" crystal, as is known in the art. The drift region dopant is selected to provide the drift region 14 with a first conductivity type, which may be "p" type or "n" type conductivity. One example is a "p" type conductivity drift region doped with boron (B) during growth of the diamond crystal to produce a concentration of about $1\times10^{15}$ cm$^{-3}$ to about $5\times10^{16}$ cm$^{-3}$ in the drift region. The drift region may have a thickness T1 in the range of about 5 µm to about 20 µm and preferably between about 8 µm to about 15 µm.

With reference to FIG. 3, a doped diamond layer 15 having a second conductivity type which is the opposite of the drift region first conductivity type is formed by CVD onto the doped diamond drift region 14. One example is an "n" type conductivity diamond layer 15 doped with phosphorus (P) during growth of the diamond crystal to produce a concentration of about $1\times10^{17}$ cm$^{-3}$ to about $5\times10^{18}$ cm$^{-3}$ in the "n" doped layer. The "n" doped layer 15 may have a thickness T2 in the range of about 0.2 µm to about 1.5 µm. It will be apparent to those skilled in the art that the drift region 14 may be doped to have "n" type conductivity and the diamond layer 15 formed on the drift layer 14 may have the opposite "p" type conductivity.

The thickness T2 of the doped diamond layer 15 that is structured into the JBS strips 16 is independent of the thickness T1 of the drift layer 14. The limitation is the width of the space charge region (SCR) 19, which should not be larger than the thickness T2 of the JBS strips 16. If the SCR 19 is greater than the thickness of the JBS strip 16, the SCR comes through to the metal contact and a conductive route is created, which results in a loss of blocking resistance. A thickness of the JBS strips of 0.2 µm is believed sufficient to generate SCRs 19 of sufficient width to shield the Schottky transition. Deposition of the doped diamond layer 15 from the gas phase under controlled conditions leads to lower defects within the diamond material, resulting in better performance.

Figure 4:
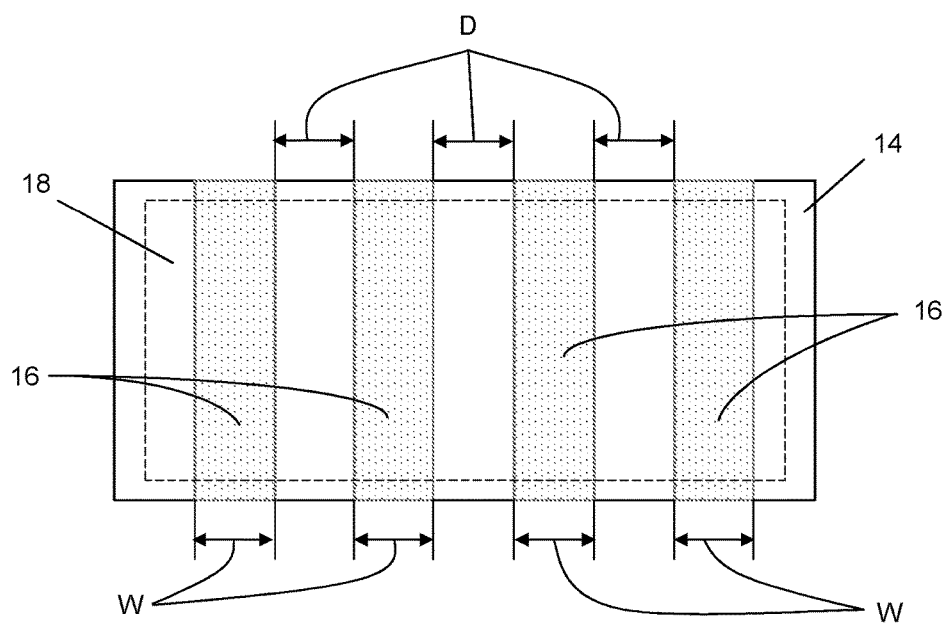
FIG. 4 is a top plan view of an embodiment of a diamond Schottky diode according to the disclosure.

After formation of the drift region 14 and doped diamond layer 15, the diamond substrate 20 is removed, and an Ohmic contact anode 12 is formed on a side of the drift region 14 opposite the "n" doped layer 15. Photolithography is used to mask the JBS areas 16 remove the "n" doped layer 15 (at 17 in FIG. 3) by dry or wet etching to leave JBS areas 16 in the form of strips having a width W and spacing distance D between the JBS areas as shown in FIG. 4. The spacing D may be about 0.5 µm to about 4 µm. Finally, a Schottky metal 18 cathode is applied to the top surface, covering the JBS areas 16 and filling the spaces between the JBS areas 16 as shown in FIG. 2. The Schottky metal 18 may be an alloy of Au, Ru, Mo, Zr, Al and/or Pt. The side walls of the JBS regions 16 are approximately perpendicular to the surface of the drift region 14, as shown in FIG. 2. In the resulting structure, the Ohmic contact anode 12 is on an opposite side of the drift region 14 from the Schottky contact.

Due to the introduction of the n-doped JBS areas, a space-charge region 19 spreads between the n-doped JBS areas 16 and the p-doped drift region 14. As a result of this space-charge region (SCR) 19, the electric field strength, which follows from the applied reverse voltage, is shielded from the Schottky transition. In contrast to a structure without such a JBS strip, where the electric field strength increases linearly at the Schottky transition with the applied reverse voltage, the resulting increase in the reverse current is thus markedly minimized. The reverse voltage, from which the Schottky transition is fully shielded, can here be adjusted by the distance between the individual JBS areas. To shield the Schottky transition, the SCR 19 has to fill the whole area D between the JBS strips 16. The width of the SCR 19 depends on the applied reverse voltage and the doping of the drift region 14. When the doping of the drift region is low, the width of the SCR can be thicker than the thickness of the JBS strips. As a result, the distance D between the JBS strips 16 determines the reverse voltage for which the Schottky transition is shielded. Due to the high doping concentration of the n-doped JBS strips, the width W and length of the JBS strips has little or no influence on the principal function of the JBS strips, which is to shield the electrical field from the Schottky transition. However, JBS strips of greater width would limit the area that can be used for current transport in the "on" state; therefore the JBS strips should be as small as possible. Although JBS areas are disclosed in the form of JBS strips 16, the structure of the JBS areas is not the most important factor. The functionality of the JBS strips 16 depends strongly on the area of the interface between the JBS strips 16 and the drift region 14. JBS areas in the form of parallel JBS strips 16 avoid local current crowding effects that may arise from structures defining irregular distances between JBS areas. The disclosed diamond Schottky diode 10 can be configured to function with an applied reverse voltage of about 5000V to about 10000V.

The described structure and manufacturing method for the JBS areas can also be transferred to unipolar power diodes on the basis of diamond with n-doped drift region. The fundamental structure here corresponds to the structure shown in FIG. 2. However, in contrast thereto, a p-doped layer is grown on an n-doped drift region and then structured. The reverse voltage, from which the electric field is shielded from the Schottky transition can also be dimensioned by the distance between the JBS areas.

Diamond Schottky diodes according to the disclosure may be employed in high performance electronics with a specific use at high temperatures (above 300° C.), under extreme environmental impacts (e.g. cosmic radiation), in satellite communication requiring extremely fast switching speeds, and in the transmission of electricity with voltages above 10 kV.

What is claimed:

1. A Schottky diode comprising:
a drift region comprising diamond having a first conductivity type;
a plurality of junction barrier Schottky regions comprising diamond having a second conductivity type opposite the first conductivity type and being arranged on a top of the drift region and separated by spaces;
at least one Schottky contact being applied to the top of the drift region, thereby covering the junction barrier Schottky regions and filling the spaces between the junction barrier Schottky regions; and
at least one Ohmic contact on the drift region.

2. The Schottky diode according to claim 1, wherein the Ohmic contact and the Schottky contact are located on opposite sides of the drift region.

3. The Schottky diode according to claim 1, wherein the drift region has a thickness of about 5 µm to about 20 µm or a thickness of about 8 µm to about 15 µm.

4. The Schottky diode according to claim 1, wherein the junction barrier Schottky regions are separated by a spacing of about 0.5 µm to about 4 µm.

5. The Schottky diode according to claim 1, wherein the junction barrier Schottky regions have a thickness of about 0.2 µm to about 1.5 µm.

6. The Schottky diode according to claim 1, wherein the first conductivity type is p-type and the second conductivity type is n-type.

7. The Schottky diode according to claim 1, being configured to operate at a reverse voltage of about 5000 V to about 10000 V.

8. The Schottky diode according to claim 1, wherein the drift region is boron doped at a concentration of about $1 \cdot 10^{15}$ cm$^{-3}$ to about $5 \cdot 10^{16}$ cm$^{-3}$.

9. The Schottky diode according to claim 1, wherein the junction barrier Schottky regions are phosphorus doped at a concentration of about $1 \cdot 10^{17}$ cm$^{-3}$ to about $5 \cdot 10^{18}$ cm$^{-3}$.

10. The Schottky diode according to claim 1, wherein the Schottky contact comprises an alloy comprising any of Au, Ru, Mo, Zr, Al, and/or Pt.

11. The Schottky diode according to claim 1, wherein the junction barrier Schottky regions are configured as strips having sidewalls being approximately perpendicular to the surface of the drift region.

12. A Schottky diode comprising:
a drift region comprising diamond having a first conductivity type;
at least one Schottky contact on the drift region;
a plurality of junction barrier Schottky regions having a second conductivity type opposite the first conductivity type and being arranged adjacent to the at least one Schottky contact, said junction barrier Schottky regions being configured as a plurality of strips spaced apart from each other; and
at least one Ohmic contact on the drift region,
wherein the at least one Schottky contact covers the junction barrier Schottky regions and fills the spaces between the junction barrier Schottky regions.

13. The Schottky diode according to claim 12, wherein the strips have sidewalls being approximately perpendicular to the surface of the drift region.

14. The Schottky diode according to claim 12, wherein the Ohmic contact and the Schottky contact are located on opposite sides of the drift region.

15. The Schottky diode according to claim 12, wherein the drift region has a thickness of about 5 µm to about 20 µm or a thickness of about 8 µm to about 15 µm.

16. The Schottky diode according to claim 12, wherein the strips forming the junction barrier Schottky regions have a spacing of about 0.5 µm to about 4 µm.

17. The Schottky diode according to claim 12, wherein the junction barrier Schottky regions have a thickness of about 0.2 µm to about 1.5 µm.

18. The Schottky diode according to claim 12, wherein the first conductivity type is p-type and the second conductivity type is n-type.

19. The Schottky diode according to claim 12, being configured to operate at a reverse voltage of about 5000 V to about 10000 V.

20. The Schottky diode according to claim 12, wherein the drift region is boron doped at a concentration of about $1 \cdot 10^{15}$ cm$^{-3}$ to about $5 \cdot 10^{16}$ cm$^{-3}$.

21. The Schottky diode according to claim 12, wherein the Schottky contact comprises an alloy comprising any of Au, Ru, Mo, Zr, Al, and/or Pt.

\* \* \* \* \*